United States Patent [19]
Kirk

[11] Patent Number: 6,091,486
[45] Date of Patent: Jul. 18, 2000

[54] BLAZED GRATING MEASUREMENTS OF LITHOGRAPHIC LENS ABERRATIONS

[75] Inventor: Joseph P. Kirk, Chelsea, N.Y.

[73] Assignee: International Business Machines Corporation, Armonk, N.Y.

[21] Appl. No.: 09/225,339

[22] Filed: Jan. 5, 1999

[51] Int. Cl.[7] .................................................. G01B 9/00
[52] U.S. Cl. ............................................................ 356/124
[58] Field of Search .................................. 356/124–127; 359/566–571

[56] References Cited

U.S. PATENT DOCUMENTS

| | | | |
|---|---|---|---|
| 5,175,594 | 12/1992 | Campbell | 356/124 |
| 5,300,786 | 4/1994 | Brunner et al. | 250/548 |

OTHER PUBLICATIONS

Joseph P. Kirk, "Astigmatism and Field Curvature from Pin–bars" SPIE vol. 1463 Optical/Laser Microlithography IV (1991), pp. 282–287.

Joseph P. Kirk, et al., "DUV Diagnostics Using Continuous Tone Photoresist" SPIE vol. 1463, Optical/Laser Microlithography IV (1991), pp. 575–579.

*Primary Examiner*—Frank G. Font
*Assistant Examiner*—Amanda Merlino
*Attorney, Agent, or Firm*—Whitham, Curtis & Whitham; H. Daniel Schnurmann, Esq.

[57] ABSTRACT

Exposures of a photosensitive material through an array of blazed gratings illuminate a lens asymmetrically to detect effects of a plurality of azimuthal aberrations including coma, astigmatism, and three-leaf and four-leaf clover aberrations. A plurality of such exposures of the array of blazed gratings at slightly differing focus allows detection of focus shift due to any aberrations present in the lens. Upon development of the plurality of exposures, contrast of each area is measured, for example, by reflection or scattering from the relief in the developed photosensitive material and the aberrations thus detected can be simulated by effective summation of individual aberration effects.

11 Claims, 5 Drawing Sheets

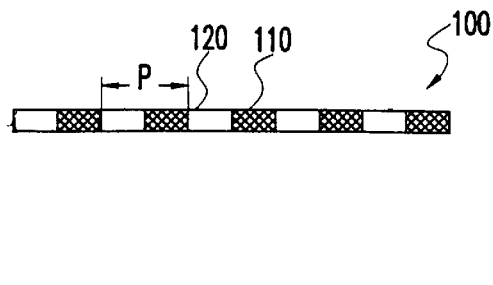
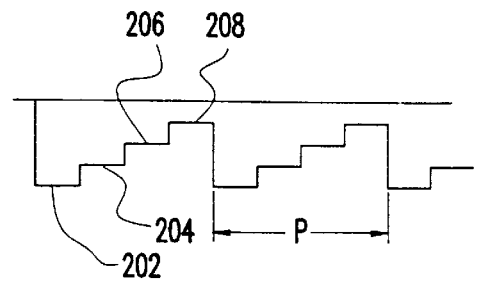
FIG.1A
FIG.2A
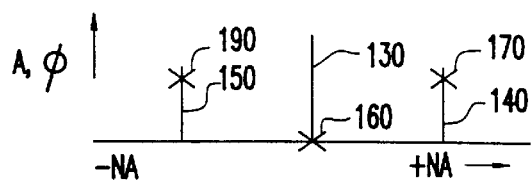
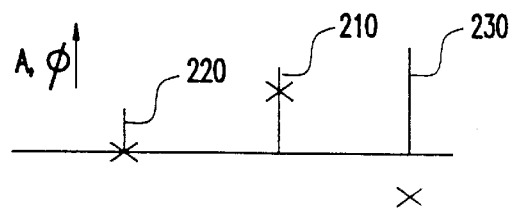
FIG.1B
FIG.2B
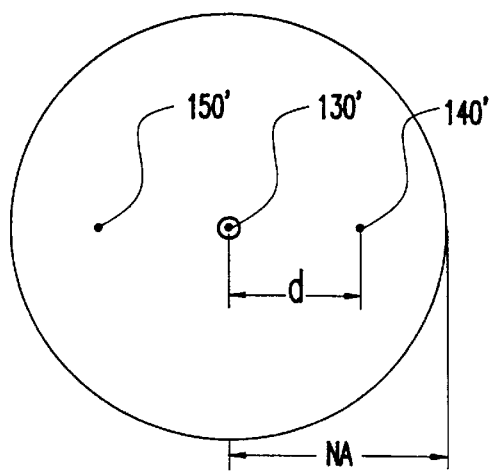
FIG.1C

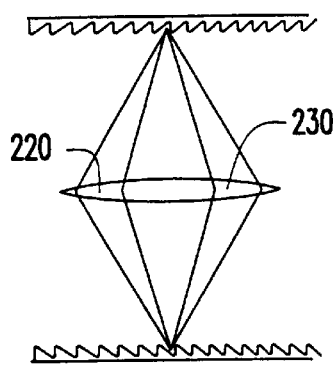
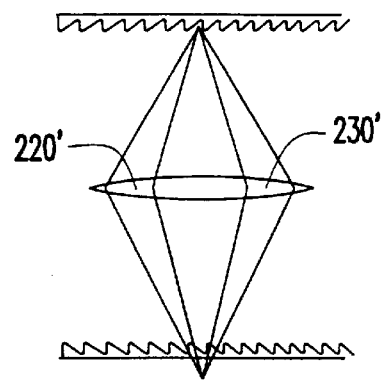
FIG.3  FIG.4
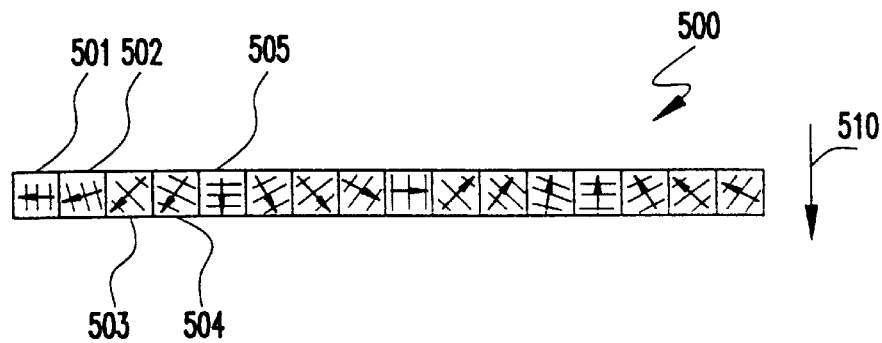
FIG.5
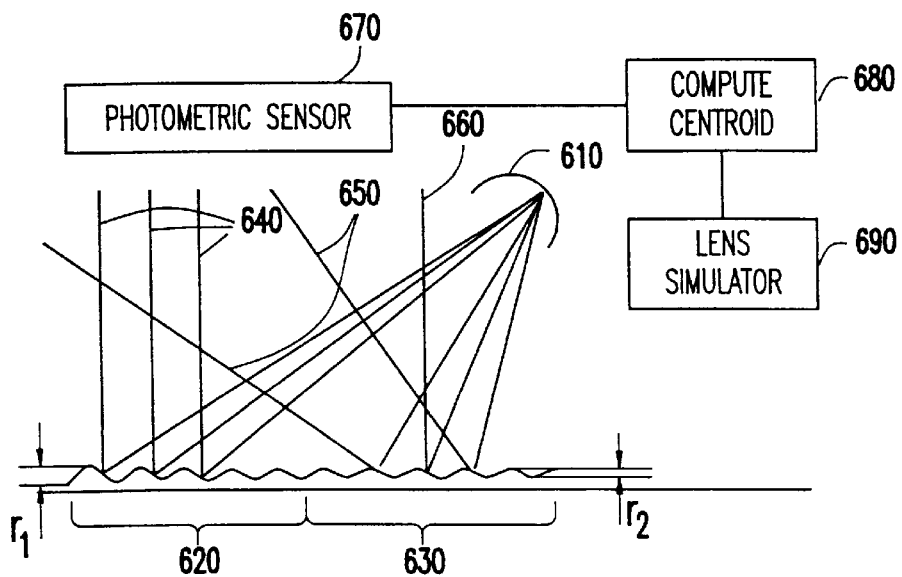
FIG.6

BLAZED GRATING MEASUREMENTS OF LITHOGRAPHIC LENS ABERRATIONS

BACKGROUND OF THE INVENTION

1. Field of the Invention

The present invention generally relates to testing and characterization of lenses and, more particularly, to the quantitative measurement of radially asymmetric aberrations in lithographic lenses.

2. Description of the Prior Art

Lithography is used in numerous manufacturing processes, especially where complex patterning for selective processing at a surface is required. For that reason, lithography is of extreme importance in the manufacture of semiconductor devices and high density integrated circuits, in particular. High density of integration yields both functional and economic advantages in integrated circuits since close spacing of components reduces signal propagation time and increases noise immunity while allowing more chips of increased functionality to be produced by a single iteration of a series of process steps on each wafer. Integration density has also been enhanced by the exploitation of various self-aligned processes with can develop features and structures of smaller size than can be produced lithographically. However, self-aligned processes rely on the prior patterning of fine features produced through lithographic processes.

While many different lithographic processes and variations thereon are known, all share the common features of covering a surface with a resist which is sensitive to a particular form of energy or incident particles, selectively exposing portions of the resist to a dose of that energy or such particles sufficient to cause differential chemical response to a developer which removes either exposed or unexposed portions of the resist (depending on whether the resist is of a positive or negative type) and performing a process (generally deposition, etching or implantation) differentially on the exposed and unexposed portions of the surface.

Lithographic processes, however, at the feature sizes required by modern integrated circuits, are subject to severe and unavoidable physical limitations related to how the exposure is made. Specifically, for radiant energy, the minimum feature size which can be obtained is related to the wavelength of the energy used for the exposure. While X-rays have been investigated and used for lithographic exposures, the nature of the required mask and difficulty of fabrication thereof at the present state of the art renders X-rays generally impractical for semiconductor fabrication and charged particle beam tools are often used when extremely small feature sizes must be obtained. However, throughput of charged particle beam tools is relatively low and optical exposure at short wavelengths (e.g. deep ultraviolet) remains the exposure medium of choice for most integrated circuit manufacture.

Optical lithography techniques are relatively well-developed and numerous devices and techniques, such as the use of phase-shift masks or reticles using interference effects to adjust exposures and doses, have been developed to enhance exposure images and reduce the minimum feature size that can be produced with light of a given wavelength. However, aberrations (e.g. localized shift of focus or departure from planarity of the best focussed image) in the projection lens system have become increasingly critical and, at the current state of the art, are a fundamental limitation on exposure tool performance. While some precorrections may be made if the aberrations are well-understood, such information is difficult to obtain with suitable accuracy for this purpose and seldom supplied by the lens manufacturer.

Additionally, lens aberrations may change over time and as-manufactured aberration measurements may become obsolete. Changes in aberrations over time may possibly cause anomalous effects in combination with any form of precorrection. Further, very slight changes in lens shape or relative location become relatively more significant at very short wavelengths. Therefore, at the level of performance now required of lens systems for optical lithography, a robust in-situ method for simultaneous measurement of coma, astigmatism and higher order aberrations is needed to support maintenance of exposure tool performance.

Unfortunately, no suitable measurement method has been available and even test bench arrangements at the present state of the art do not support the required accuracy of measurement or permit accurate characterization of the aberrations which may be present. In particular, such systems generally cannot detect some aberrations such as coma when the illumination in the lens is radially symmetrical. Coma and other aberrations (e.g. focus, astigmatism) have required the use of reticles specifically designed to detect a particular form of aberration. Therefore, separate tests are required for each aberration and the sequence of tests is not practical for a production environment due to the increased testing time required for separate tests. Further, separate tests may also be a source of error in measurement and, in any event, do not cover a full set of azimuthal aberrations (e.g. non-radially symmetrical aberrations including coma, so-called three-leaf and four-leaf clover and the like), much less simultaneously, or otherwise provide a capability of minimizing non-productive time of the lithography tool.

SUMMARY OF THE INVENTION

It is therefore an object of the present invention to provide a robust in-situ methodology and apparatus for evaluation and measurement of lens aberrations, including coma, astigmatism and higher order aberrations.

It is another object of the present invention to provide a practical methodology and apparatus for periodically monitoring lens performance in a lithographic exposure tool.

It is a further object of the invention to provide a methodology and system for simultaneous measurement and characterization of a full set of azimuthal aberrations.

In order to accomplish these and other objects of the invention, a method of measuring a plurality of azimuthal aberrations of a lens is provided including the steps of making exposures of respective areas of a photosensitive material through a blazed grating in a plurality of orientations and over a range of focus distances covering a range greater than expected focus changes due to aberrations to be measured, measuring relative contrast in each respective area after development of the photosensitive material, and summing effects of a plurality of aberrations to simulate the relative contrast.

In accordance with another aspect of the invention, a test is provided reticle for measurement of azimuthal aberrations comprising an array of blazed gratings, each capable of forming an asymmetrical interference pattern of radiant energy passing therethrough and being rotationally oriented in a direction different from other gratings in the array, and a mask surrounding the array of gratings.

BRIEF DESCRIPTION OF THE DRAWINGS

The foregoing and other objects, aspects and advantages will be better understood from the following detailed description of a preferred embodiment of the invention with reference to the drawings, in which:

FIG. 1A is a cross-sectional view of an amplitude grating known in the art,

FIGS. 1B and 1C illustrate the illumination pattern across the pupil of a lens system produced by the grating of FIG. 1A, FIG. 2A is an enlarged cross-sectional view of a blazed grating in accordance with the invention, FIG. 2B illustrates the illumination pattern across the pupil of a lens system produced by the grating of FIG. 2A, FIG. 3 illustrates a simplified optical system exposing a focussed image of the blazed grating of FIG. 2A, FIG. 4 illustrates a simplified optical system exposing a slightly defocussed image of the blazed grating of FIG. 2A, FIG. 5 illustrates a preferred form of a blazed grating in accordance with the invention, FIG. 6 illustrates an exemplary image produced in adjacent fields by the blazed grating of FIG. 5.

DETAILED DESCRIPTION OF A PREFERRED EMBODIMENT OF THE INVENTION

Figure 7:
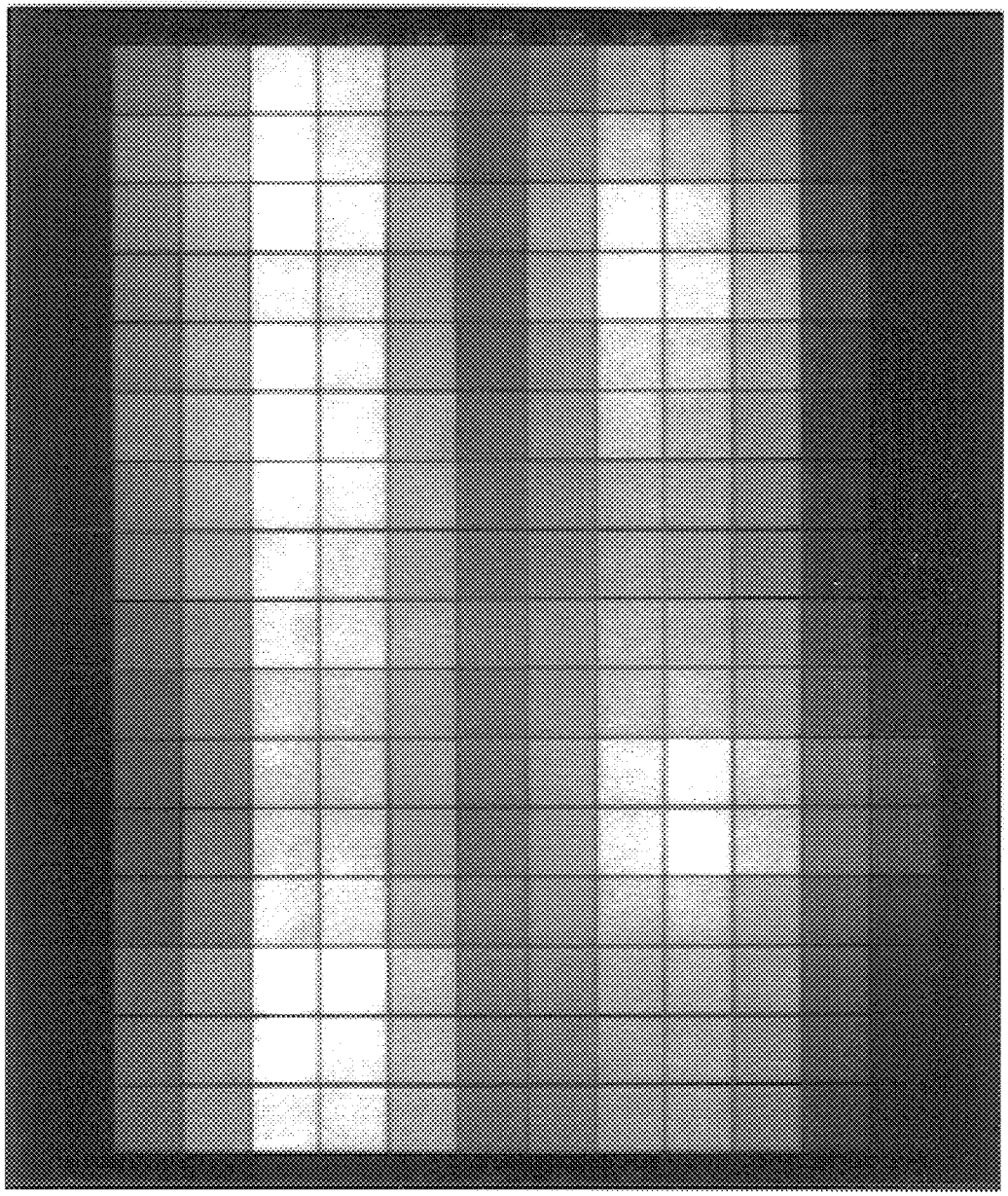
FIG. 7 illustrates an image produced by the blazed grating of FIG. 5 for a full test exposure in accordance with the invention.

Referring now to the drawings, and more particularly to FIG. 1A, there is shown, in cross-section, an amplitude grating 100 of a known type. The illumination pattern produced at the lens pupil is illustrated in FIGS. 1B and 1C. Specifically, grating 100 provides a regular pattern of opaque areas 110 and transparent areas 120, typically in the form of lines extending into and out of the page, as illustrated. As is known, such a grating produces interference effects in dependence on the relationship between the illuminating light wavelength and the dimensions of the opaque and transparent regions 110, 120.

These interference effects cause a variation in illumination amplitude and phase at different locations in the plane of the lens pupil (e.g. center of the lens system), as illustrated in FIG. 1B and 1C. The central illumination component 130' and the first order diffraction components 140' and 150' are schematically depicted as distributed across the pupil having a numerical aperture of NA in FIG. 1C and the relative amplitudes 130, 140 and 150 and phases, 160, 170 and 180, respectively, are shown graphically in FIG. 1B. The relative locations and spacing of the illumination components, d, will vary with the grating frequency, p, as is well-understood in the art.

It should be understood that the image produced at the image plane or target plane of the lens will be a superposition of these components forming an image of grating 100. It should also be appreciated that the amplitude and phase of the first order diffraction components shown in FIG. 1B are symmetrical and rotation of the grating through 180° produces an image with the same depth of modulation regardless of the aberration. Measuring the difference in image modulation for these two grating orientations will give no indication of an aberration such as coma.

Referring now to FIG. 2A, a blazed grating is illustrated in enlarged cross-section. The term "blazed" connotes that some parameter of the grating varies in a substantially saw-tooth fashion. In this case, respective regions of the grating are fabricated with different thicknesses and thus develop relative phase delays of light passing through regions 202, 204, 206 and 208, respectively and, in effect, act substantially as many small triangular prisms which are thus well-described as "blazed". Other combinations of steps or other cross-sectional shapes can be used and are suitable for practice of the invention as long as the interference pattern created by the grating is asymmetrical in amplitude.

Due to the relative phase differences, the interference pattern is altered relative to the amplitude grating of FIG. 1A and the relative amplitudes and phase of the central image component 210 and the first order diffraction components 220 and 230, while located in the same relative positions in the lens pupil plane as shown for 130', 140' and 150' in FIG. 1C (for the same grating frequency, p), are highly asymmetrical in amplitude and phase. As with grating 100, the image formed at the image or target plane of the lens system will be a superposition of these components. However, the asymmetry of illumination at different locations in the plane of the lens pupil can be distinguished when aberrations cause focussing in different respective planes. In particular, the principal component in terms of amplitude is now first order diffraction component 230 rather than the central component 210.

To illustrate this effect, FIGS. 3 and 4 show the imaging of a grating by a lens system which is focussed and slightly defocussed, respectively. Recalling that the image produced is a superposition of the diffraction components and that an image of the reticle or mask (in this case, the grating) will ideally be produced at the image plane, FIG. 3 shows first order diffraction components being brought to focus in the same plane. Since the image of the grating will be a series of lines, if all diffraction components are brought to the same focus, a high-contrast image will be produced and if formed on a photosensitive resist, which is then developed, a difference in solubility of exposed and unexposed resist will cause a high degree of relief as portions of the thickness of the resist layer are dissolved during development.

In FIG. 4, however, diffraction components 220 and 230 (labelled 220' and 230' in FIG. 4 for clarity) are brought to focus in front of and behind the resist layer due to aberrations in the lens. This differential in focus due to aberrations defocusses the image and contrast of the image of the grating is reduced. Therefore, there will be a more uniform exposure of the resist due to defocussing and, upon development of the resist, a lower level of relief will be produced. Perhaps more importantly, exposure by off-axis lens illumination and thus non-radially symmetrical aberration is emphasized and is now sensitive to angular orientation of the grating around the central axis of the lens.

To facilitate making exposures at effectively different angular orientations of the blazed grating, a preferred blazed grating is shown in FIG. 5. Essentially, the grating is in the form of a slit aperture divided along its length into a plurality of areas. Sixteen square areas (e.g. 501, 502, 503, 504, 505) are preferred as a matter of convenience but the exact number and shape of the areas and even the configuration as a slit as contrasted with other possible arrays of areas are not essential to the practice of the invention but support some convenience as will be discussed in detail below. The slit aperture functions as a mask and surrounds the array to prevent exposure of areas adjacent the image of the array at the target plane.

Each respective area contains a blazed grating with the orientation of strip areas (e.g. 202, 204, 206, 208) of the grating angularly rotated from other areas. In the preferred blazed grating including sixteen areas, each area is rotated 22.5° from the immediately adjacent areas such that every fourth area (e.g. 501 and 505) is rotated through 90° and the total rotation over the full length of the strip is 22.5° less than a full rotation of 360°, or 337.5°.

Thus sixteen different angular orientations can be simultaneously exposed and a sequence of such exposures can be made side-by-side, shifting the strip in the direction shown by arrow 510, slightly altering focus from exposure to exposure. A focus change of approximately one third of the wavelength of exposure radiation divided by the square of the numerical aperture is preferred but not critical to the practice of the invention. The number of exposures made and the focus distance interval between exposures should cover a range greater than the expected focus change due to aberrations to be measured. This multiple exposure produces a matrix of cells which differ in exposure by angular orientation of lens illumination in one orthogonal direction and differing by focus in the other coordinate direction.

Recalling from the discussion of FIGS. 3 and 4 that accurate focus at the plane of the resist layer or its surface develops as a greater amount of relief or difference in surface height of the developed resist than in fields where aberrations are present and the image is defocussed to a greater or lesser degree, the degree of relief resulting at respective exposure locations is a function of the aberrations present. Information can be extracted from the degree of relief in the developed resist in the manner indicated in FIG. 6 as will now be explained.

Specifically, it should be understood that the resist is not fully removed at any particular area exposure location and that the height of undulations or difference in surface height of the remaining developed resist corresponds to contrast in the image of the blazed grating and that such contrast is degraded by aberrations which cause a change in the plane of best focus at various locations within the lens. Therefore, the presence of aberrations and alteration of focus reduces the degree of relief. These differences in relief are preferably detected optically in the manner generally indicated in FIG. 6.

When the developed resist is illuminated from the side at an oblique angle (preferably through a substantial solid angle relative to the resist surface and from directions corresponding to grating orientation angles), as schematically shown by light source 610 and the reflected light observed in a direction generally perpendicular to the resist surface, a more strongly undulating surface 620 (e.g. over height $r_1$) will reflect or scatter more light in the direction of observation as indicated by ray 640 than from a more gently undulating over height $r_2 < r_1$) or smoother surface 630, as indicated by ray 660. That is, a smoother surface will reflect a higher percentage of incident light specularly at a relatively more shallow angle, as indicated by rays 650, that will not be incident on a detector 670. Accordingly, regions where images are formed by gratings of different orientations will focus differently according to the aberrations present, as is evident in FIG. 7. In the absence of aberration, all regions will be focussed in the same way, regardless of grating orientation.

It should be understood that the undulations in the resist surface follow the orientation of the grating in respective areas 501, 502, etc. of blazed grating 500 of FIG. 5 and illumination 610 should extend around the image or be provided for each angle the undulations may assume in order to minimize variation in brightness due to incidence on differently oriented undulations. However, lighting irregularities can be compensated to a relatively large degree by calibration for a particular light source.

(By the same token, since the undulations extend in the same direction in FIG. 6, areas 620 and 630 correspond to different exposures at slightly differing focus but exposed through the same region of blazed grating 500. It should be appreciated that the relatively better focussed and more strongly undulating region 620 could be produced by freedom from aberrations at the intended focus distance or the presence of aberrations well-compensated by focus change among the sequence of exposures of the slit blazed grating 500. Conversely, less well focussed and smoother region 630 could be produced by aberrations shifting the intended focus distance or the focus being shifted (in the absence of aberrations) in the sequence of exposures of slit blazed grating 500.)

Quantitatively, the height or degree of relief varies with the logarithm of the ratio in exposure dose in respective areas in which the resist loss is measured. This measurement can be made with an atomic force microprobe or in other ways. However the optical measurement exploiting the effect illustrated in FIG. 6 is much preferred for convenience and in view of further evaluation which will be explained in connection with FIG. 10, below. Another technique which is of a substantial convenience will now be explained in connection with FIGS. 8 and 9.

Figure 8:
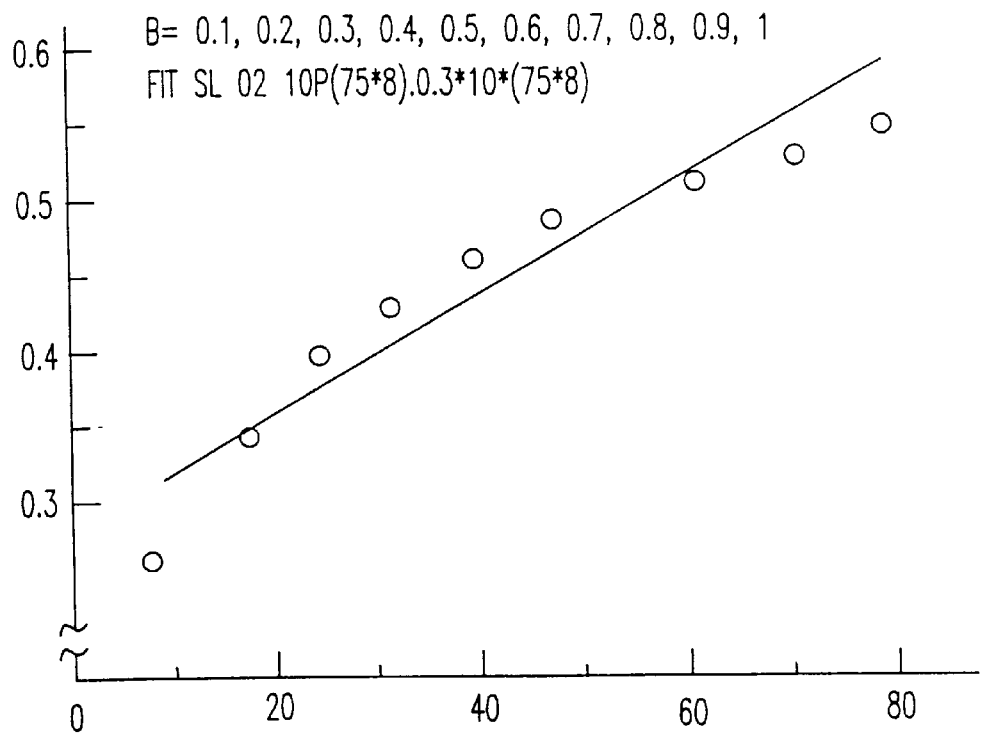
FIGS. 8 and 9 illustrate a perfecting feature of the invention.
Figure 9:
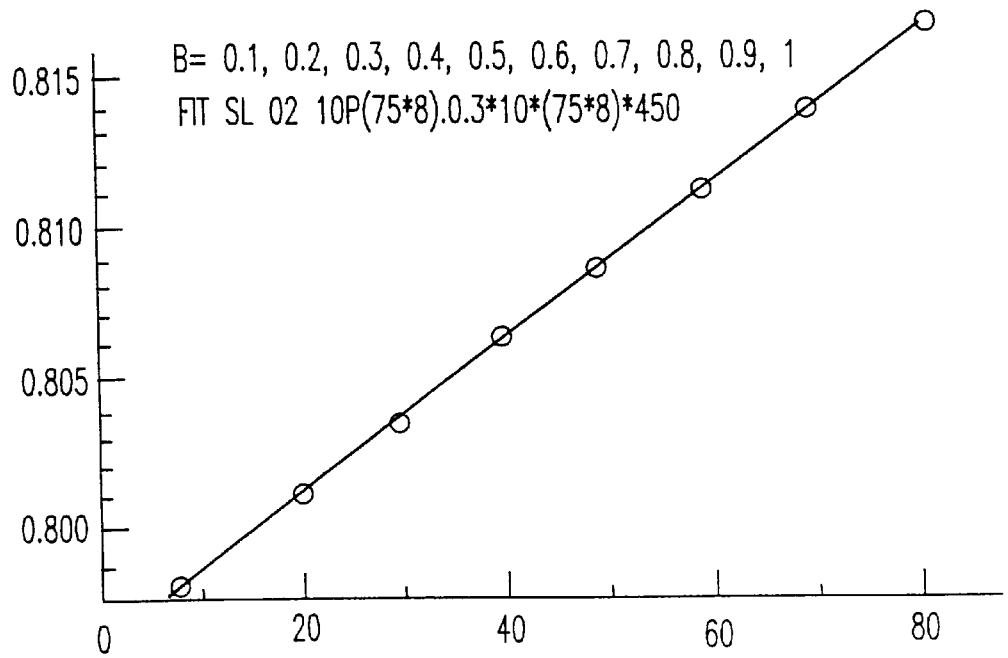

Specifically, if resist relief is graphically depicted as a function of exposure dose, the actual variation of resist thickness after development is shown in FIG. 8 and is clearly logarithmic and over a significant range of height values. If, however, after exposure with a sequence of slit exposures, a further blanket "drive-in" exposure of a small exposure dose energy (e.g. about 450 millijoules for AZ7500 resist) the height variation in resist relief is very much reduced but made almost exactly linear, as shown in FIG. 9. For example, the drive-in exposure can be accomplished by removing the reticle 100 and giving the resist a further featureless dose of about 450 mJ/cm$^2$. The difference in relief and resulting reflectance/scattering, even though reduced to a relatively small range, has been found entirely sufficient to the practice of the invention. In essence, while the difference in relief height is reduced, the difference in scattering with relief height remains readily observable, as described above, and, in any event, the focus and grating orientation information of interest will not be degraded, as will be appreciated from the following discussion of FIG. 10.

Returning now to FIG. 6 and referring to FIGS. 7 and 10, the completion of the measurement process in accordance with the invention will now be described. Specifically, the light reflected in the manner discussed above is preferably measured for each exposure area by a photometric sensor 670, the centroid (or other suitable parameter) of brightness along each line corresponding to a particular angle of the grating and a single area of slit blazed grated 500 (but with varying focus distance) is determined. A compensation should be made unless relief/brightness is linearized by a drive-in additional exposure dose. A compensation may also be made if illumination of the resist is not radially symmetrical.

A dark field photo sensor record of the resist relief image is shown in FIG. 7. This image is recorded in the manner illustrated in FIG. 6 where only the first order diffraction (the first harmonic of the relief grating image) is recorded as degrees of brightness. In this particular case, the first harmonic of the resist image minimizes where it is generally considered to be the best (e.g. Gaussian) focus, resulting in the central darker band of FIG. 7. Bright spots or areas to the right or left of the intended focus distance thus indicate a focus distance variance which effectively compensates for the aberration. The vertical location, frequency and size of bright spots is indicative of the radial asymmetry of the aberration.

Figure 10:
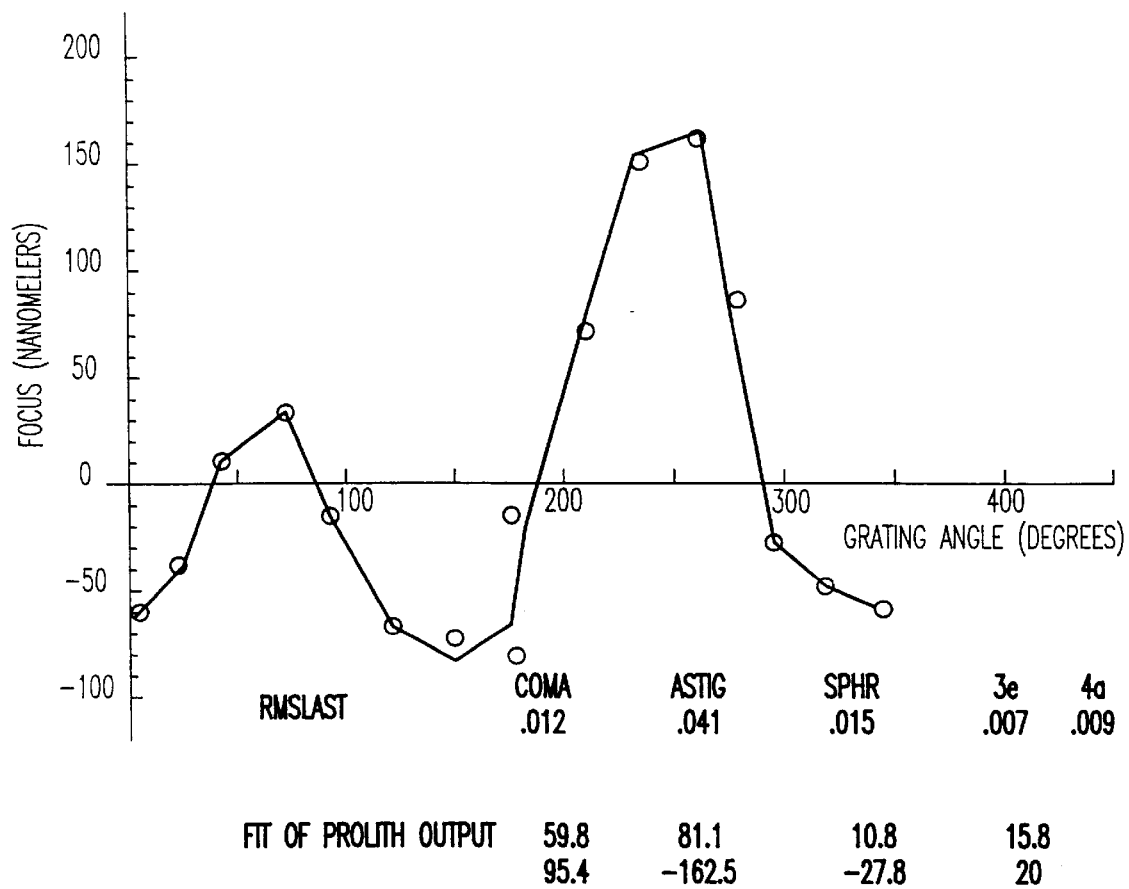
FIG. 10 illustrates a simulation process by which measured aberrations are preferably quantized in accordance with the invention.

Thus the variation in location of the centroid of brightness indicates the severity of the aberration and can be graphically depicted as shown in FIG. 10. This variation in aberrations can then be simulated with a commercially available lens simulation software application by adjusting individual types of aberrations and effectively summing their combined effects for a best match and, when a best match is obtained, the individual aberrations included in the simulation are reported, as indicated in the numerical data superimposed on the graph of FIG. 10 for coma, astigmatism, spherical distortion and three-leaf and four-leaf clover aberrations.

In view of the foregoing it is seen that the invention can simultaneously provide a measurement and characterization of a full range of azimuthal aberrations from a rapidly and simply executed series of exposures of a blazed slit grating requiring non-productive use of the exposure tool. The remainder of the process, including the linearizing drive-in exposure, can be carried out after the sequence of exposures are made through the lens in-situ in the exposure tool. Thus, the process of the invention does not significantly compromise production time of the tool and is ideal for monitoring lens performance periodically over an extended period of time. Additionally only a single blazed grating or test reticle is used, eliminating a source of error while producing an accurate quantitative measurement of a plurality of aberrations simultaneously. However, blazed gratings having differing grating period, p, can be used in additional iterations of the measurement process in order to sample different regions of the lens pupil and provide a more complete characterization of the aberrations of the lens.

While the invention has been described in terms of a single preferred embodiment, those skilled in the art will recognize that the invention can be practiced with modification within the spirit and scope of the appended claims.

What is claimed is:

1. A method of measuring a plurality of azimuthal abberrations of a lens including the steps of making exposures of respective areas of a photosensitive material through a blazed grating in a plurality of orientations and over a range of focus distances covering a range greater than expected focus changes due to aberrations to be measured, measuring relative contrast in each said respective area after development of said photosensitive material, and summing effects of a plurality of aberrations to simulate said measured relative contrast.

2. A method as recited in claim 1, wherein said step of measuring relative contrast is performed with a probe.

3. A method as recited in claim 1, wherein said step of measuring relative contrast includes steps of illuminating, at an oblique angle, said respective areas of said photosensitive material after development, and observing relative scattering of illumination from relief in a surface of said photosensitive material after development.

4. A method as recited in claim 1, including the further step of making a further exposure of said photosensitive material prior to development.

5. A method as recited in claim 4, wherein said step of measuring relative contrast is performed with a probe.

6. A method as recited in claim 4, wherein said step of measuring relative contrast includes steps of illuminating, at an oblique angle, said respective areas of said photosensitive material after development, and observing relative scattering of illumination from relief in a surface of said photosensitive material after development.

7. A method as recited in claim 1, wherein said step of making exposures is repeated using another blazed grating having a frequency which differs from a frequency of said blazed grating.

8. A method as recited in claim 4, wherein said step of making exposures is repeated using another blazed grating having a frequency which differs from a frequency of said blazed grating.

9. A method as recited in claim 6, wherein said step of making exposures is repeated using another blazed grating having a frequency which differs from a frequency of said blazed grating.

10. A test reticle for measurement of azimuthal aberrations comprising an array of grating means, each said grating means being capable of forming an asymmetrical interference pattern of rediant energy passing therethrough and being rotationally oriented in a direction different from other said grating means in said array, and a mask surrounding the array of grating means.

11. A test reticle as recited in claim 10, wherein said array is a linear array and said mask includes a slit aperture.

* * * * *